United States Patent
Chang et al.

(10) Patent No.: US 8,227,858 B2
(45) Date of Patent: Jul. 24, 2012

(54) POWER MOSFET

(75) Inventors: Yi-Chi Chang, Hsinchu County (TW); Chia-Lien Wu, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 248 days.

(21) Appl. No.: 12/685,644

(22) Filed: Jan. 11, 2010

(65) Prior Publication Data
US 2011/0169076 A1 Jul. 14, 2011

(51) Int. Cl.
*H01L 29/78* (2006.01)
(52) U.S. Cl. .............. 257/332; 257/E29.262; 257/335
(58) Field of Classification Search ............... 257/332, 257/335–349, E29.262
See application file for complete search history.

(56) References Cited

U.S. PATENT DOCUMENTS
2006/0014349 A1*  1/2006  Williams et al. .......... 438/270
2010/0072544 A1*  3/2010  Pearse et al. ............. 257/331
* cited by examiner

*Primary Examiner* — Cuong Q Nguyen
*Assistant Examiner* — Tran Tran
(74) *Attorney, Agent, or Firm* — Jianq Chyun IP Office

(57) ABSTRACT

A power MOSFET is described. A trench is in a body layer and an epitaxial layer. An isolation structure is on the substrate at one side of the trench. An oxide layer is on the surface of the trench. A first conductive layer fills the trench and extends to the isolation structure. A dielectric layer is on the first conductive layer and isolation structure and has an opening exposing the first conductive layer. At least one source region is in the body layer at the other side of the trench. A second conductive layer is on the dielectric layer and electrically connected to the source region while electrically isolated from the first conductive layer by the dielectric layer. A third conductive layer is on the dielectric layer and electrically connected to the first conductive layer through the opening of the dielectric layer. The second and third conductive layers are separated.

19 Claims, 13 Drawing Sheets

POWER MOSFET

BACKGROUND OF THE INVENTION

1. Field of the Invention

The invention relates to a semiconductor device and a method of forming the same, and more particularly, to a power metal-oxide-semiconductor field effect transistor (MOSFET) and a method of forming the same.

2. Description of Related Art

Power MOSFETs are widely applied to power switching devices, such as power supplies, converters, or low-voltage motor controllers. A conventional power MOSFET usually adopts a vertical structural design to enhance the device density. In a power MOSFET, each drain region is formed on the back-side of a chip, and each source region and each gate are formed on the front-side of the chip. The drain regions of the transistors are connected in parallel so as to endure a considerable large current.

Generally speaking, a power MOSFET includes a cell area, a gate metal area and a metal field plate area. The gate metal area is for transmitting the gate signal, and the metal field plate area is for enhancing the electric field of the device. The gate metal area and the metal field plate area are called a terminator. As the level of integration of power MOSFETs increases, the dimension of the same is reduced as well. Therefore, how to effectively integrate the cell area, the gate metal area and the metal field plate area of the power MOSFET so as to reduce the dimension thereof has become one of the main topics in the industry.

SUMMARY OF THE INVENTION

Accordingly, the present invention provides a power MOSFET, in which a cell area, a gate metal area and a metal field plate area are effectively integrated. The present invention further provides a method of forming a power MOSFET. The method adopts a trimming process and a self-aligned process to prevent misalignments between the contact plugs and the trenches, and thus, the cell pitch is reduced and the level of integration of the device is enhanced. The present invention provides a power MOSFET including a substrate of a first conductivity type, an epitaxial layer of the first conductivity type, a body layer of a second conductivity type, an isolation structure, a first oxide layer, a dielectric layer, at least one source region of the first conductivity type, a second conductive layer and a third conductive layer. The epitaxial layer is disposed on the substrate. A body layer is disposed in the epitaxial layer, wherein a trench is disposed in the body layer and in a portion of the epitaxial layer. The isolation structure is disposed on the substrate at one side of the trench. The first oxide layer is disposed on the surface of the trench. The first conductive layer fills in the trench and extends to a portion of the isolation structure. The dielectric layer is disposed on the first conductive layer and the isolation structure and has an opening exposing a portion of the first conductive layer. The source region is disposed in the body layer at the other side of the trench. The second conductive layer is disposed on the dielectric layer and electrically connected to the source region while electrically isolated from the first conductive layer by the dielectric layer. The third conductive layer is disposed on the dielectric layer and electrically connected to the first conductive layer through the opening of the dielectric layer, wherein the second conductive layer and the third conductive layer are separated from each other.

According to an embodiment of the present invention, the first conductive layer includes a first part filling in the trench and a second part extending from the first part to the portion of the isolation structure, and the dielectric layer covers a portion of the first part. The surface of the first part of the first conductive layer is no higher than that of the body layer.

According to an embodiment of the present invention, the first conductive layer includes a first part filling in the trench and a second part extending from the first part to the portion of the isolation structure, and the dielectric layer does not cover the first part. The surface of the first part of the first conductive layer is no higher than that of the body layer.

According to an embodiment of the present invention, the body layer and isolation structure and partially overlapped or separated from each other.

According to an embodiment of the present invention, the power MOSFET further includes a second oxide layer at least disposed on a bottom of the trench. The second oxide layer includes an oxide with a dielectric constant less than 4. In addition, the second oxide is further disposed between the top surface of the isolation structure and the first conductive layer.

According to an embodiment of the present invention, the power MOSFET further includes a mask layer disposed between the second oxide layer and the first oxide layer and between the top surface of the isolation structure and the second oxide layer. The mask layer includes silicon nitride.

According to an embodiment of the present invention, the power MOSFET further includes a mask pattern covering the isolation structure, wherein the mask pattern is disposed between the mask layer and the isolation structure. The mask pattern comprises silicon nitride.

According to an embodiment of the present invention, the power MOSFET further includes a mask pattern covering the isolation structure. The mask pattern comprises silicon nitride.

According to an embodiment of the present invention, the power MOSFET further includes at least one doped region of the second conductivity type disposed between the second conductive layer and the body layer.

According to an embodiment of the present invention, the power MOSFET further includes a pad oxide layer disposed between the body layer and the first conductive layer.

According to an embodiment of the present invention, the isolation structure includes a field oxide (FOX) structure or a shallow trench isolation (STI) structure.

According to an embodiment of the present invention, the first conductive layer includes doped polysilicon.

According to an embodiment of the present invention, the second conductive layer and the third conductive layer includes aluminium.

According to an embodiment of the present invention, the first conductive type is N-type while the second conductivity type is P-type, or the first conductivity type is P-type while the second conductivity type is N-type.

The present invention further includes a method of forming a MOSFET. An epitaxial layer of a first conductivity type is formed on a substrate of the first conductivity type. An isolation structure is formed on the substrate. Afterwards, a body layer of a second conductivity type is formed in the epitaxial layer at one side of the isolation structure. A mask layer is formed on the substrate, wherein the mask layer has at least one first mask pattern disposed on the body layer, a second mask pattern covering the isolation structure and a first opening between the first mask pattern and the second mask pattern. A trench corresponding to the first opening is formed in the body layer and in a portion of the epitaxial layer by using the mask layer as a mask. A first oxide layer is formed on the surface of the trench. A first conductive layer fills in the trench and extends to a portion of the isolation structure. A trimming process is performed to the first mask pattern for reducing the line width of the first mask pattern. At least one source region of the first conductivity type is formed in the body layer at one side of the trench by using the trimmed first mask pattern as a mask. A dielectric material layer is formed on the substrate covering the trimmed first mask pattern and the first conductive layer. A portion of the dielectric material layer is removed to form a dielectric layer, wherein the dielectric layer exposes the surface of the trimmed first mask pattern and has a second opening exposing a portion of the first conductive layer. The trimmed first mask pattern is removed. A second conductive layer and a third conductive layer which are separated from each other are formed on the substrate, wherein the second conductive layer is electrically connected to the source region, and the third conductive layer is electrically connected to the first conductive layer through the second opening of the dielectric layer.

According to an embodiment of the present invention, the first conductive layer includes a first part filling in the trench and a second part extending from the first part to the portion of the isolation structure, and the dielectric layer covers a portion of the first part. The surface of the first part of the first conductive layer is no higher than that of the body layer.

According to an embodiment of the present invention, the first conductive layer includes a first part filling in the trench and a second part extending from the first part to the portion of the isolation structure, and the dielectric layer does not cover the first part. The surface of the first part of the first conductive layer is no higher than that of the body layer.

According to an embodiment of the present invention, the body layer and isolation structure and partially overlapped or separated from each other.

According to an embodiment of the present invention, the method further includes, after the step of forming the first oxide layer and before the step of forming the first conductive layer, forming a second oxide layer on the bottom of the trench and between the second mask pattern and the first conductive layer. The second oxide layer includes an oxide with a dielectric constant smaller than 4.

According to an embodiment of the present invention, the step of forming the second oxide layer includes sequentially forming a mask layer and an oxide material layer on the substrate. The oxide material layer located on sidewalls of the trench, the first mask pattern and the second mask pattern is removed by using the mask layer as a stop layer. The mask layer uncovered by the second oxide layer is removed. The mask layer includes silicon nitride.

According to an embodiment of the present invention, the method further includes, after the step of forming the trench and before the step of forming the first oxide layer, removing the second mask pattern covering the isolation structure.

According to an embodiment of the present invention, the step of forming the first conductive layer includes forming a conductive material layer on the substrate filling the trench and covering the mask layer. A patterned photoresist layer is formed on the conductive material layer. An etching process is performed by using the patterned photoresist layer as a mask, so as to remove a portion of the conductive material layer.

According to an embodiment of the present invention, the method further includes, after the step of removing the trimmed first mask pattern and before the step of forming the second and third conductive layers, forming at least one doped region of the second conductivity type in the body layer by using the dielectric layer as a mask, and the second conductive layer being electrically connected to the doped region.

According to an embodiment of the present invention, the trimming process includes a wet etching process.

According to an embodiment of the present invention, the method further includes, after the step of forming the epitaxial layer and before the step of forming the body layer, forming a pad oxide material layer on the substrate.

According to an embodiment of the present invention, the isolation structure includes a field oxide structure or a shallow trench isolation structure.

According to an embodiment of the present invention, the first conductive layer includes doped polysilicon.

According to an embodiment of the present invention, the second conductive layer and the third conductive layer include aluminium.

According to an embodiment of the present invention, the first conductivity type is N-type while the second conductivity type is P-type, or the first conductivity type is P-type while the second conductivity type is N-type.

In light of the foregoing, in the power MOSFET of the present invention, a conductive layer fills in the trench which is located in both the cell area and the terminator and extends to a portion of the isolation structure, so that the cell area and the terminator can be effectively integrated to reduce the dimension of the device.

Besides, the method of the present invention adopts a trimming process and a self-aligned process to form the contact plugs of power MOSFETs, so that misalignments do not occur between the contact plugs and the trenches. Therefore, the cell pitch is greatly reduced to enhance the level of integration of the device. Furthermore, the method of the present invention is simple and does not require additional photomasks. The formation of the source regions, the doped regions, and the contact plugs can be completed by using the self-aligned process, so that the production cost is significantly reduced and the competitive advantage is achieved. Moreover, the gate oxide layer (that is, the first oxide layer) of the present invention is formed by a single thermal oxidation process. Consequently, deterioration of the device performance caused by discontinuous interface of a conventional gate oxide layer does not occur. The bottom oxide layer (that is, the second oxide layer) formed on the bottoms of the trenches is made of an oxide with a dielectric constant smaller than 4. The gate-to-drain capacitance $C_{gd}$ can thus be lowered to effectively reduce the switching loss.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
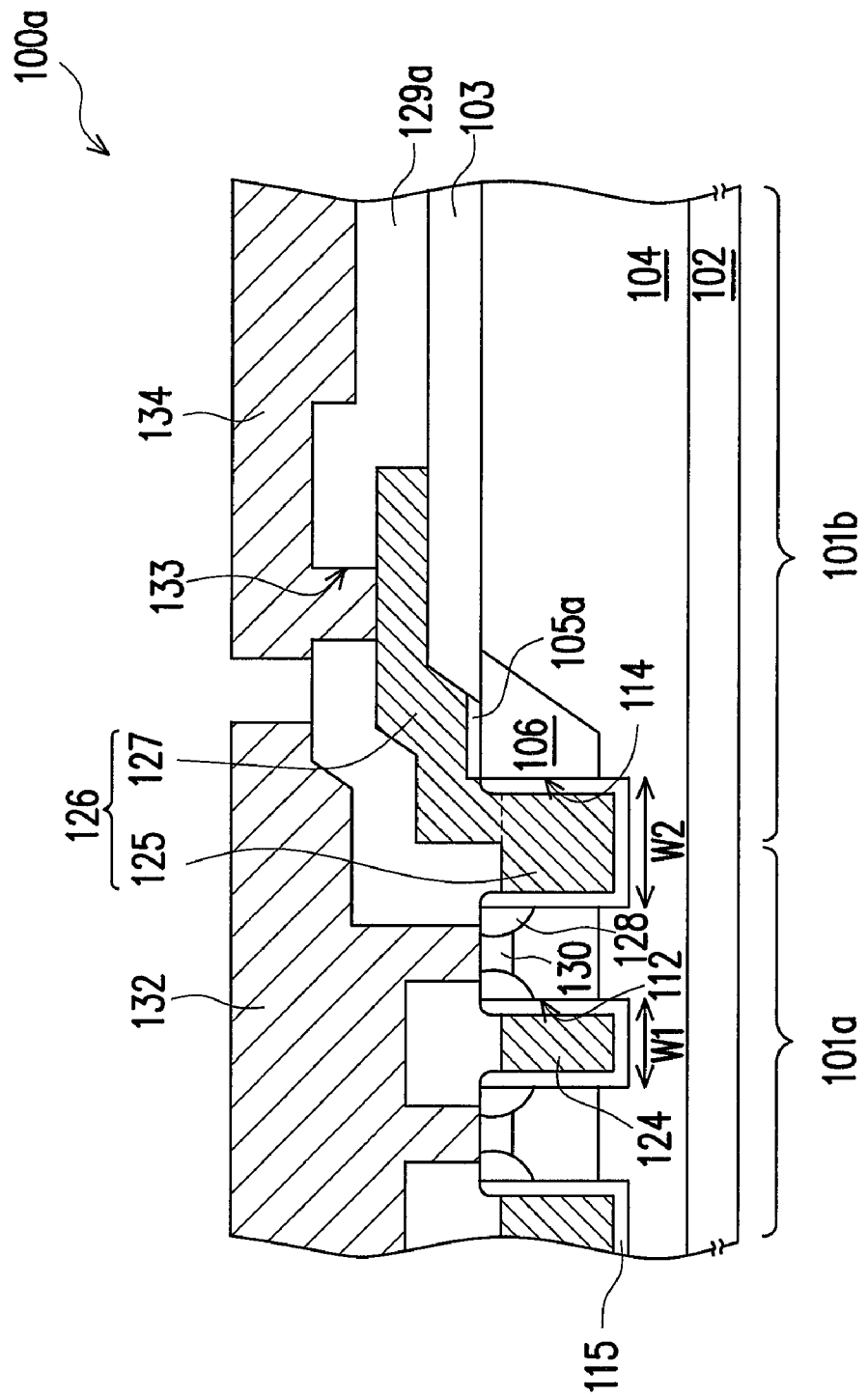
FIG. 1 schematically illustrates a cross-sectional view of a power MOSFET according to an embodiment of the present invention.

FIG. 1 schematically illustrates a cross-sectional view of a power MOSFET according to an embodiment of the present invention.

Referring to FIG. 1, a power MOSFET 100a of the present invention includes a substrate 102 of a first conductivity type, an epitaxial layer 104 of the first conductivity type, a body layer 106 of a second conductivity type, an isolation structure 103, a pad oxide layer 105a, an oxide layer 115, a conductive layer 124, a conductive layer 126, a dielectric layer 129a, at least one source region 128 of the first conductivity type, at least one doped region 130 of the second conductivity type, a conductive layer 132 and a conductive layer 134.

The substrate 102 is, for example, a heavily N-doped (N+) silicon substrate, which serves as a drain region of the power MOSFET 100a. The epitaxial layer 104 is disposed on the substrate 102. The epitaxial layer 104 is a lightly N-doped (N−) epitaxial layer, for example. N-type dopants with higher concentration are referred to as N+; N-type dopants with lower concentration are referred to as N−. The body layer 106 is disposed in the epitaxial layer 104. The body layer 106 is a P-type body layer, for example. Besides, trenches 112 and a trench 114 are disposed in the body layer 106 and in a portion of the epitaxial layer 104. The width of the trench 114 is greater than that of the trenches 112 by about 1-2 times.

The isolation structure 103 is disposed on the substrate 102 at one side of the trench 114. The isolation structure 103 is a field oxide (FOX) structure or a shallow trench isolation (STI) structure, for example. The isolation structure 103 and the body layer 106 can be partially overlapped or separated from each other. The embodiment in which the isolation structure 103 and the body layer 106 are partially overlapped is provided for illustration purposes, and is not construed as limiting the present invention. The oxide layer 115 is disposed on the surfaces of the trenches 112 and the trench 114. The oxide layer 115 includes silicon oxide, for example. The oxide layer 115 has a thickness of about 100-1000 Å, for example. In an embodiment, the oxide layer 115 has a thickness of about 500 Å, for example.

The conductive layer 124 fills in the trenches 112. The conductive layer 126 fills in the trench 114 and extends to a portion of the isolation structure 103. The conductive layer 124 and the conductive layer 126 include N+ doped polysilicon, for example. Besides, a pad oxide layer 105a can be optionally disposed between the body layer 106 and the conductive layer 126. The pad oxide layer 105a includes silicon oxide, for example. The dielectric layer 129a is disposed on the conductive layer 124, the conductive layer 126 and the isolation structure 103 and has an opening 133 exposing a portion of the conductive layer 126. The dielectric layer 129a includes silicon oxide, borophosphosilicate glass (BPSG), phosphosilicate glass (PSG), fluorosilicate glass (FSG), or undoped silicon glass (USG), for example.

Figure 2:
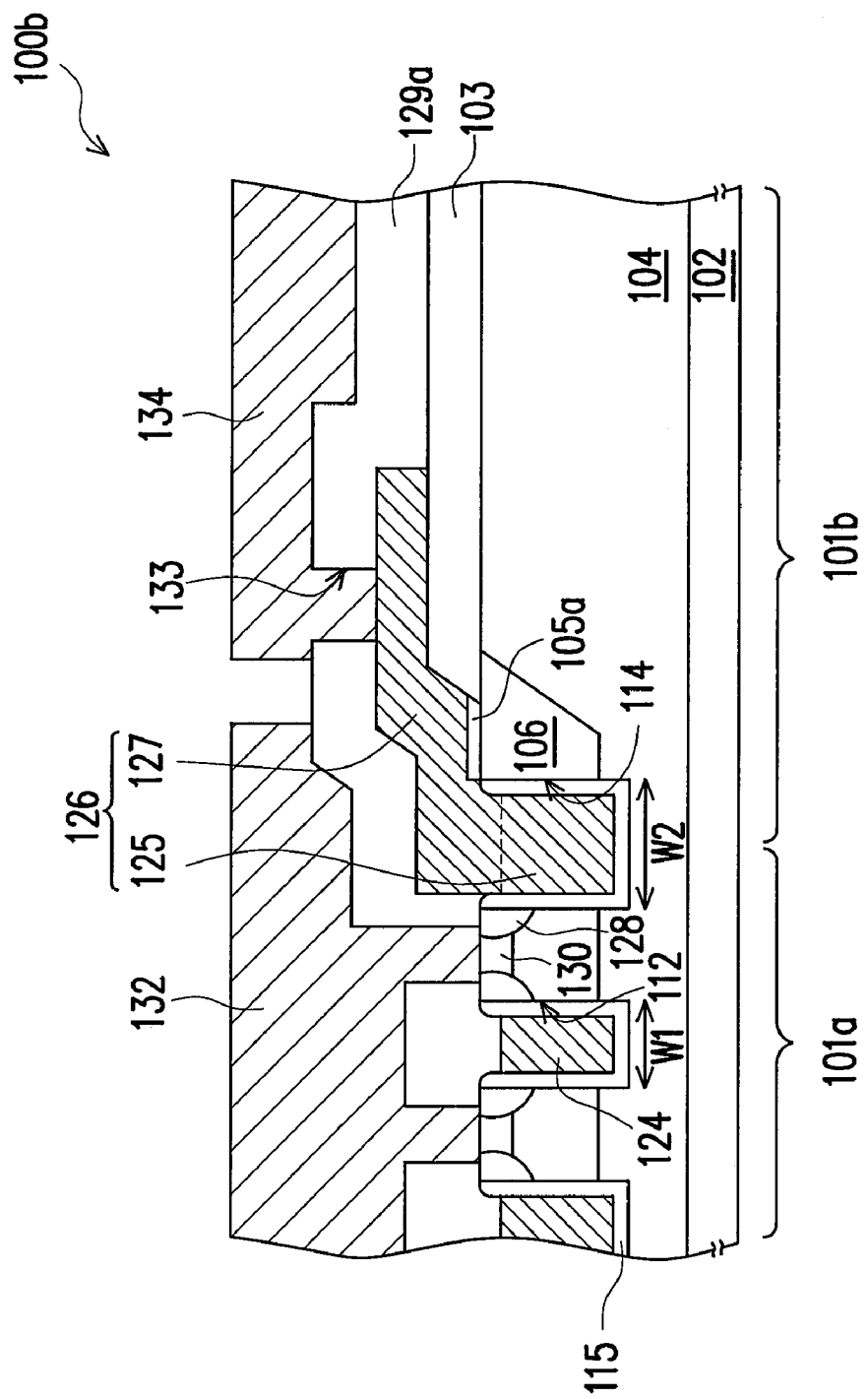
FIG. 2 schematically illustrates a cross-sectional view of a power MOSFET according to another embodiment of the present invention.

It is noted that the conductive layer 126 includes a first part filling in the trench 114 and a second part 127 extending from the first part 125 to a portion of the isolation structure 103, and the dielectric layer 129a covers a portion of the first part 125, as shown in FIG. 1. However, the present invention is not limited thereto. In another embodiment, the first part 125 and the second part 127 of the conductive layer 126 are aligned in their borders at the top of the trench 114; that is, the dielectric layer 129a does not cover the first part 125, as shown in FIG. 2. Further, the surface of either the conductive layer 124 or the first part 125 of the conductive layer 126 is no higher than that of the body layer 106. In other words, the surface of either the conductive layer 124 or the first part 125 of the conductive layer 126 is substantially equal to or lower than that of the body layer 106.

The source regions 128 are disposed in the body layer 106 at the other side of the trench 114. In this embodiment, four source regions 128 are provided for illustration purposes. However, the number of the source regions 128 is not limited by the present invention. It is appreciated by persons skilled in the art that one or more source regions can be disposed in the body layer 106 at the other side of the trench 114 upon the process requirements. In this embodiment, except one source region 128 is disposed in the body layer 126 adjacent to the trench 114, other source regions 128 are disposed in the body layer 106 beside each trench 112. The source regions 128 are N+ doped regions, and the N-type dopants include phosphorus or arsenic, for example. In addition, doped regions 130 can be optionally disposed between the conductive layer 132 and the body layer 106, so as to reduce the resistance between the conductive layer 132 and the body layer 106. The doped regions 130 are P+ doped regions, and the P-type dopants include boron, for example. In this embodiment, two doped regions 130 are provided for illustration purposes. However, the number of the doped regions 130 is not limited by the present invention. That is, the number of the doped regions 130 can alternatively be one or more than two.

The conductive layer 132 is disposed on the dielectric layer 129a and electrically connected to the source regions 128 and the doped regions 130 while electrically isolated from the conductive layer 126 by the dielectric layer 129a. The conductive layer 134 is disposed on the dielectric layer 129a and electrically connected to the conductive layer 126 through the opening 133 of the dielectric layer 129a. Besides, the conductive layer 132 and the conductive layer 134 are separated from each other. The conductive layer 132 and the conductive layer 134 includes aluminium, for example.

In the power MOSFET 100a of the present invention, the cell area 101a is located on the left side of FIG. 1 while the terminator 101b is located on the right side of FIG. 1. The trench 114 is located in both the cell area 101a and the terminator 101b. In the cell area 101a, the conductive layer 132 serves as a source metal layer, the substrate 102 serves as a drain region, the metal layers 124 and 126 each serve as a gate, and the oxide layer 115 serves as a gate oxide layer. In the terminator 101b, the conductive layer 134 serves as a gate meta layer and a metal field plate layer, and the conductive layer 134 is electrically connected to the cell area 101a through the conductive layer 126.

In view of the above, in the power MOSFET 100a of the present invention, the trench 114 is located in both the cell area 101a and the terminator 101b, and the conductive layer 126 fills in the trench 114 and extends to a portion of the isolation structure 103, so that the cell area 101a and the terminator 101b including the gate metal area and the metal field plate area can be effectively integrated so as to reduce the dimension of the device. Compared with a conventional power MOSFET, the power MOSFET of the present invention can reduce the dimension of the terminator by about 10-20 um, so that the level of integration of the device can be significantly enhanced.

Figure 3:
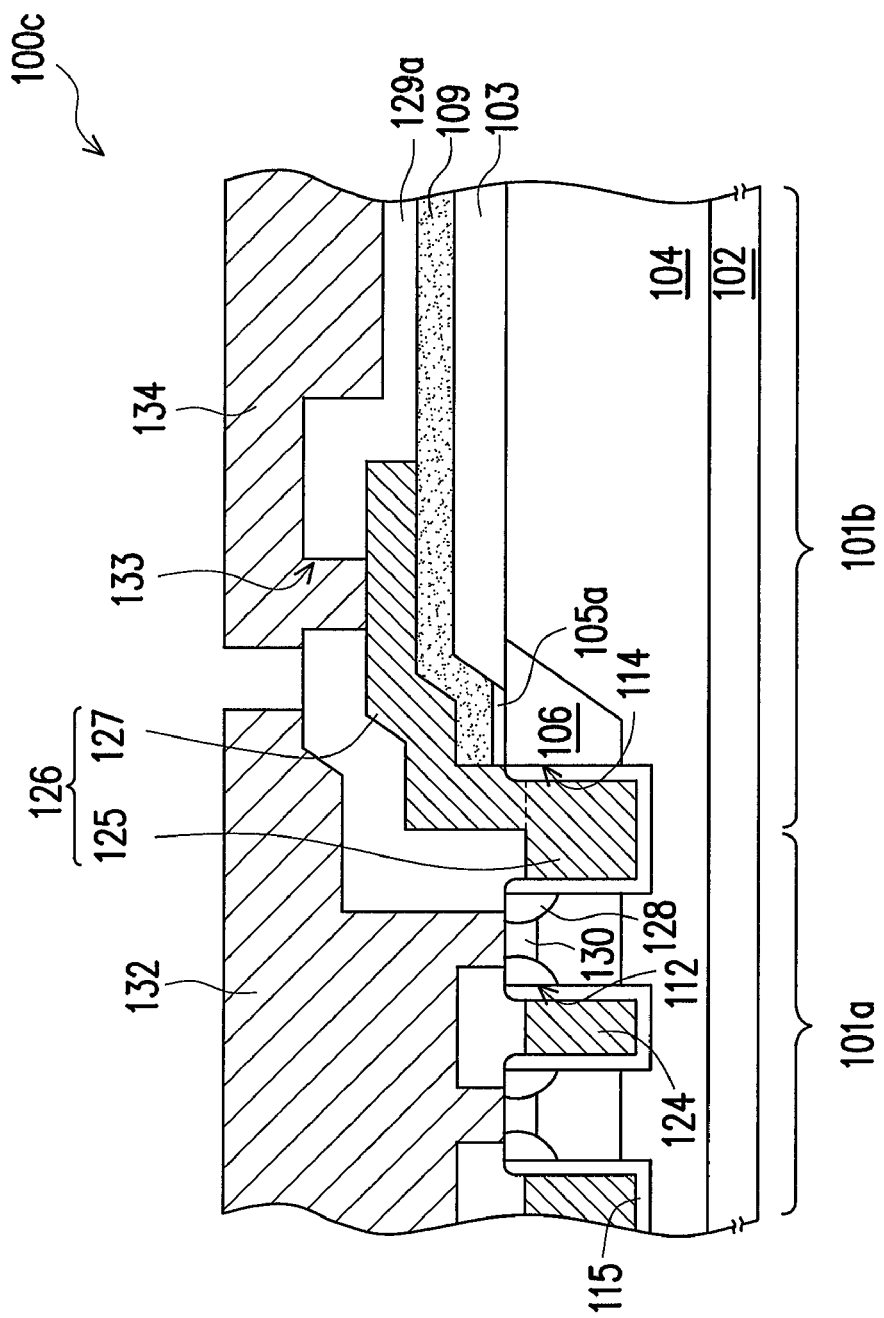
FIG. 3 schematically illustrates a cross-sectional view of a power MOSFET according to yet another embodiment of the present invention.

Besides, to make the process of the cell area 101a compatible with that of the terminator 101b, in addition to the elements of the power MOSFET 100a, a mask pattern 109 can be optionally disposed to cover the isolation structure 103, as shown in the power MOSFET 100c of FIG. 3. The mask pattern 109 includes silicon nitride, and the thickness thereof is about 5000-6000 Å, for example.

Figure 4:
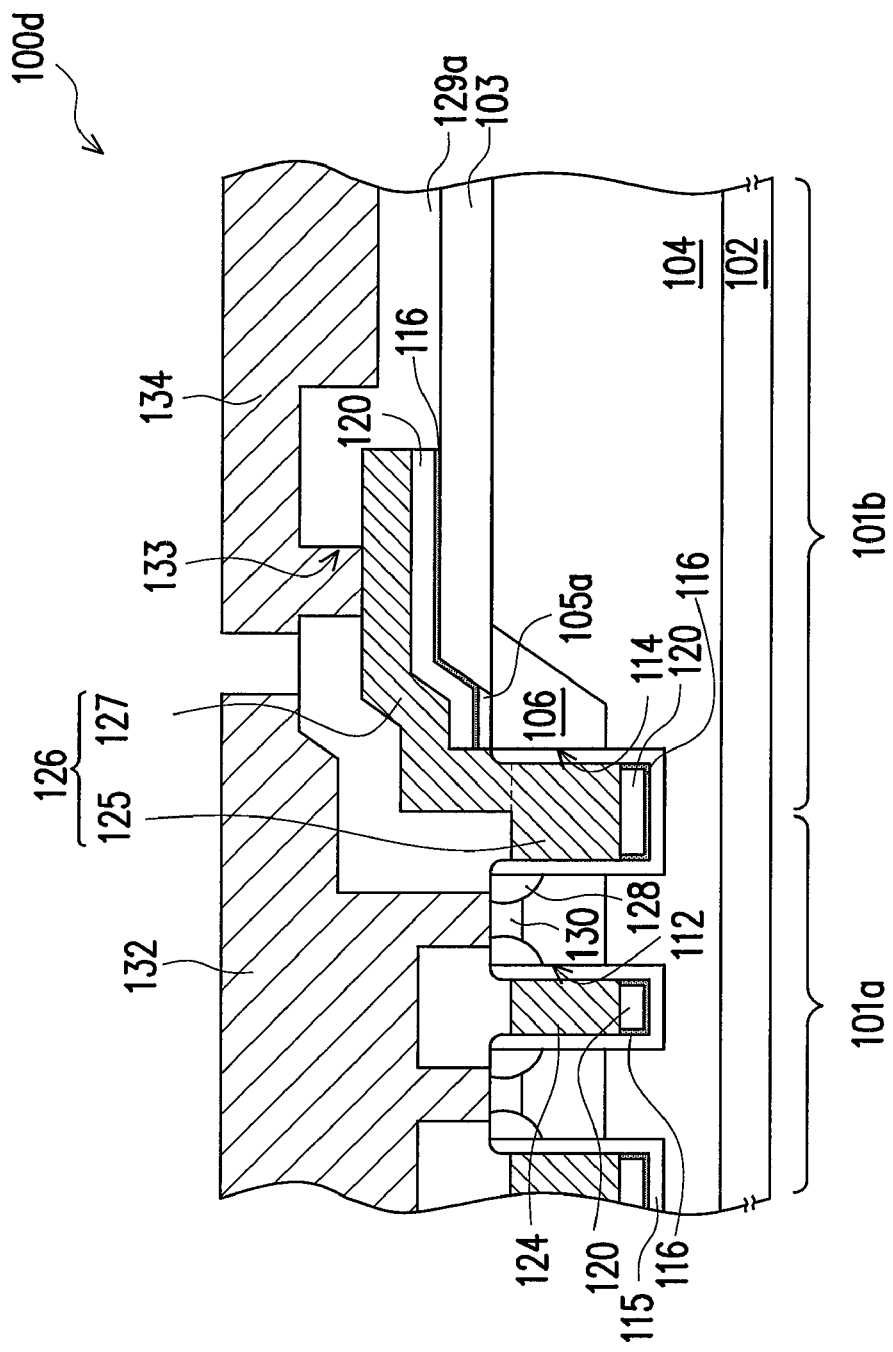
FIG. 4 schematically illustrates a cross-sectional view of a power MOSFET according to still another embodiment of the present invention.

Further, to lower the gate-to-drain capacitance $C_{gd}$ so as to effectively reduce the switching loss, an oxide layer 120 can be optionally disposed on the bottoms of the trenches 112 and the trench 114, as shown in the power MOSFET 100d of FIG. 4. The oxide layer 120 includes an oxide with a dielectric constant less than 4. The oxide layer 120 is a silicon oxide layer having a thickness of about 2000 Å, for example. In addition, the oxide layer 120 further disposed between the top surface of the isolation structure 103 and the conductive layer 126. Moreover, a mask layer 116 can be optionally disposed between the oxide layer 120 and the oxide layer 115 and between the oxide layer 120 and the top surface of the isolation structure 103. The mask layer 116 is a silicon nitride layer having a thickness of about 200 Å, for example.

Figure 5:
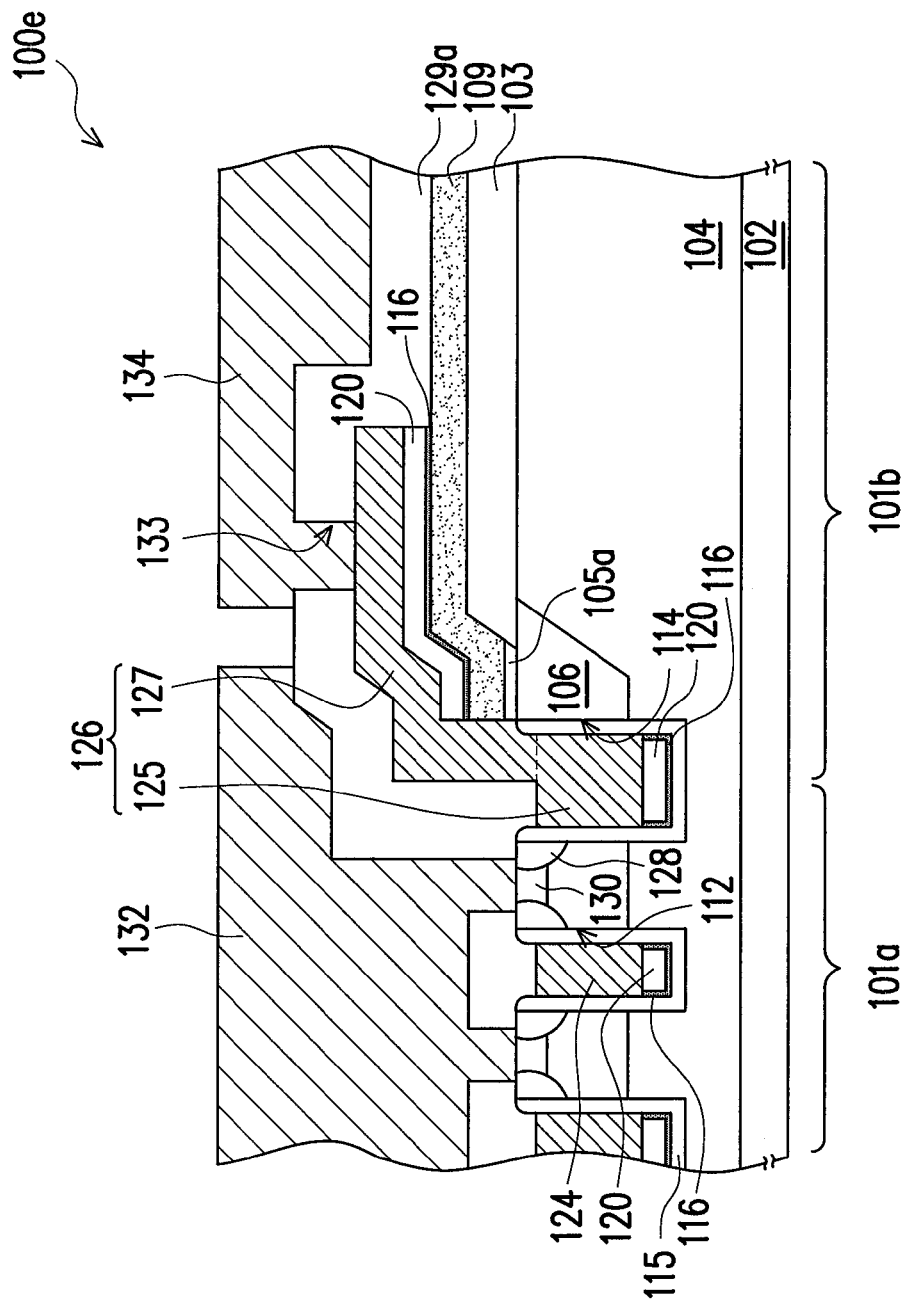
FIG. 5 schematically illustrates a cross-sectional view of a power MOSFET according to still another embodiment of the present invention.

It is for sure that the elements of FIGS. 3 and 4 can be integrated together, and the mask pattern 109 is disposed between the mask layer 116 and the isolation structure 103, as shown in the power MOSFET 100e of FIG. 5.

The above-mentioned embodiments in which the first conductivity type is N-type and the second conductivity type is P-type are provided for illustration purposes, and are not construed as limiting the present invention. It is appreciated by persons skilled in the art that the first conductivity type can be P-type while the second conductivity type can be N-type.

The method of forming the power MOSFET of the present invention is described below. The method of forming the most complicated structure (such as the power MOSFET 100e of FIG. 5) is described first, the methods of forming the other structures are similar without some process steps.

FIGS. 6A to 6H schematically illustrate cross-sectional views of a method of forming a power MOSFET according to an embodiment of the present invention.

Figure 6A:
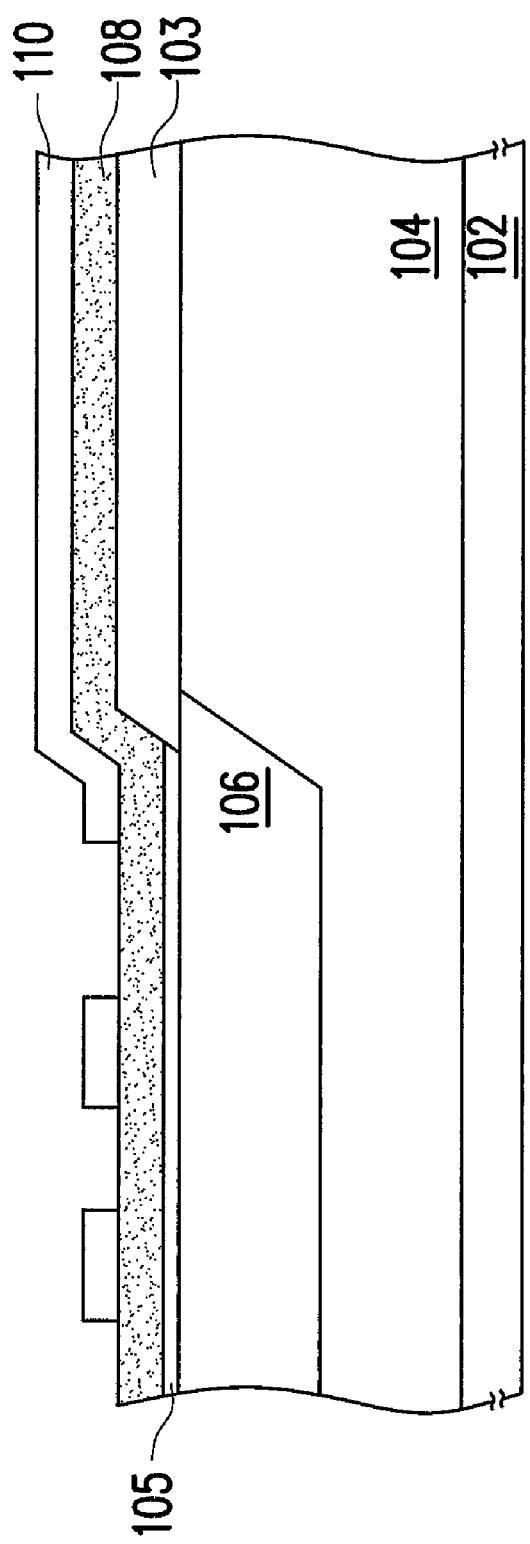
FIGS. 6A to 6H schematically illustrate cross-sectional views of a method of forming a power MOSFET according to an embodiment of the present invention.

Referring to FIG. 6A, an epitaxial layer 104 of a first conductivity type is formed on a substrate 102 of the first conductivity type. The substrate 102 is, for example, an N+ silicon substrate. The epitaxial layer 104 is, for example, an N-epitaxial layer, and the forming method thereof includes performing a selective epitaxy growth (SEG) process. Thereafter, an isolation structure 103 is formed on the substrate 102. The isolation structure is a FOX structure or STI structure, for example.

A body layer 106 of a second conductivity type is then formed in the epitaxial layer 104 at one side of the isolation structure 103. The body layer 106 is a P-type body layer, and the forming method thereof includes performing an ion implantation process and a subsequent drive-in process, for example. Besides, the isolation structure 103 and the body layer 106 can be partially overlapped or separated from each other. In an embodiment of the invention, after the step of forming the isolation structure 103 and before the step of forming the body layer 106, a pad oxide material layer 105 can be optionally formed on the substrate 102. The pad oxide material layer 105 prevents a tunneling effect that results from the ion implantation process for forming the body layer 106. The pad oxide material layer 105 includes silicon oxide, and the forming method thereof includes performing a thermal oxidation process, for example.

Afterwards, a mask material layer 108 and a patterned photoresist layer 110 are sequentially formed on the substrate 102. The mask material layer 108 includes silicon nitride, and the forming method thereof includes performing a chemical vapor deposition (CVD) process, for example. In an embodiment, the mask material layer 108 is, for example, a single silicon nitride layer having a thickness of about 5000 Å~6000 Å, as shown in FIG. 1. In another embodiment (not shown), the mask material layer 108 can also be a multi-layer stacked structure, for example, a double-layer stacked structure including a bottom silicon nitride layer and a top silicon oxide layer, depending on the process requirements.

Figure 6B:
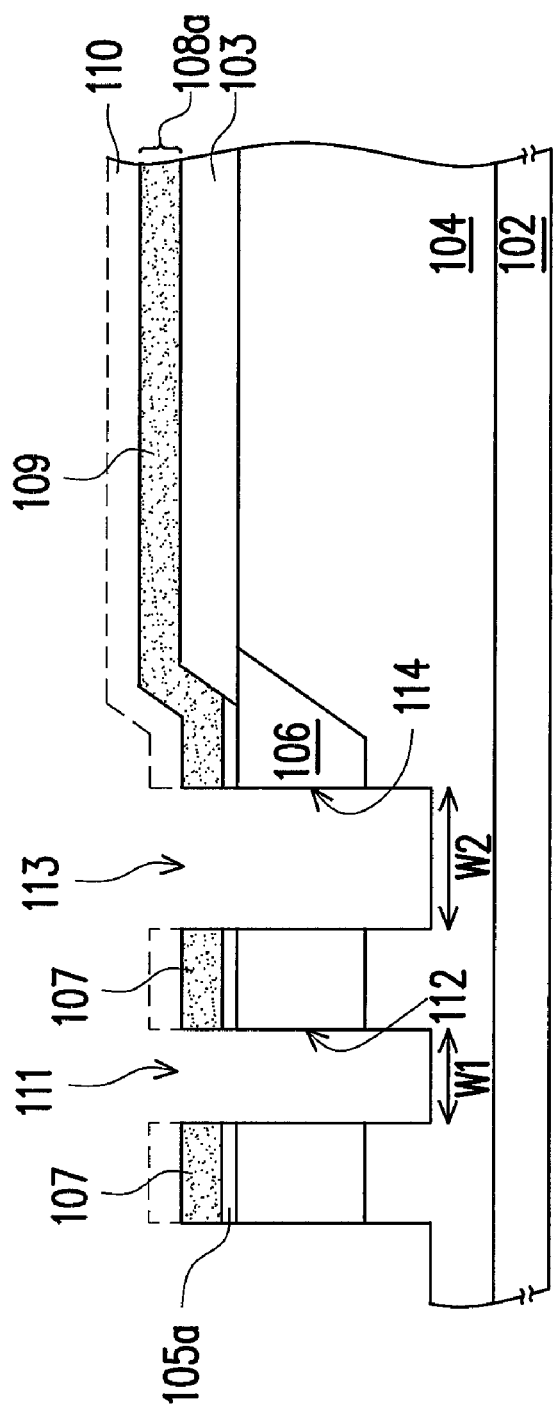

Referring to FIG. 6B, the mask material layer 108 and the pad oxide material layer 105 are sequentially patterned by using the patterned photoresist layer 110 as a mask, so as to form a pad oxide layer 105a and a mask layer 108a on the substrate 102. The mask layer 108a has mask patterns 107 on the body layer 106, a mask pattern 109 covering the isolation structure 103, an opening 111 between the adjacent mask patterns 107, and an opening 113 between the mask pattern 109 and the mask pattern 107 adjacent thereto. In this embodiment, two mask patterns 107 are provided for illustration purposes. However, the number of the mask patterns 107 is not limited by the present invention. That is, the number of the mask patterns 107 can alternatively be one or more than two. Subsequently, the patterned photoresist layer 110 is removed.

Thereafter, a dry etching process is performed by using the mask layer 108a as a mask, so as to form trenches 112 corresponding to the openings 111 and a trench 114 corresponding to the opening 113 in the body layer 106 and in a portion of the epitaxial layer 104. The width of the trench 114 is greater than that of the trenches 112 by about 1-2 times. In an embodiment, after the step of forming the trenches 112 and the trench 114, an isotropic etching process can be optionally performed to the surfaces of the trenches 112 and the trench 114, so as to remove the surface damages of the trenches 112 and the trench 114. Afterwards, a sacrificial oxide layer (not shown) can be optionally formed on the substrate 102 and subsequently removed, so as to repair the damaged crystal lattices on the surfaces of the trenches 112 and the trench 114. It is noted that when the mask material layer 108 is a double-layer stacked structure including a bottom silicon nitride layer and a top silicon oxide layer, the top silicon oxide layer is removed during the step of removing the sacrificial oxide layer.

Figure 6C:
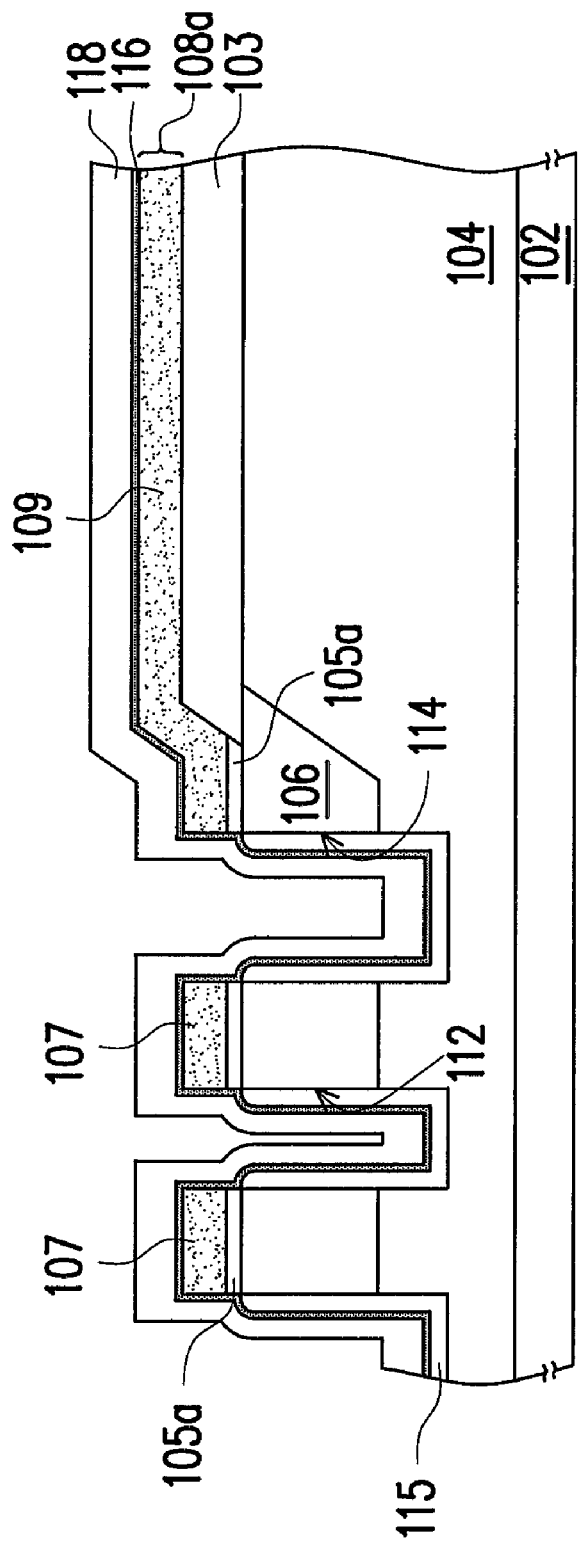

Referring to FIG. 6C, an oxide layer 115 is formed on the surfaces of the trenches 112 and the trench 114. The oxide layer 115 includes silicon oxide, and the forming method thereof includes performing a thermal oxidation process, for example. The oxide layer 115 has a thickness of about 100-1000 Å, for example. In an embodiment, the oxide layer 115 has a thickness of about 500 Å.

Thereafter, a mask layer 116 and an oxide material layer 118 are sequentially formed on the substrate 102. The method of forming the mask layer 116 and the oxide material layer 118 includes performing a CVD process, for example. The mask layer 116 is, for example, a silicon nitride layer having a thickness of about 200 Å. The oxide material layer 118 includes an oxide with a dielectric constant smaller than 4. The oxide material layer 118 is, for example, a silicon oxide layer having a thickness of about 4000 Å. However, due to the limitation in the CVD process, the oxide material layer 118 has a greater thickness on the tops of the mask patterns 107 and the mask pattern 109 and on the bottoms of the trenches 112 and the trench 114 than on the sidewalls of the trenches 112, the trench 114, the mask patterns 107 and the mask pattern 109. In an embodiment, the thickness of the oxide material layer 118 on the tops of the mask patterns 107 and the mask pattern 109 and on the bottoms of the trenches 112 and the trench 114 is about 4000 Å; however, the thickness of the same on the sidewalls of the trenches 112, the trench 114, the mask patterns 107 and the mask pattern 109 is about 2000 Å.

Figure 6D:
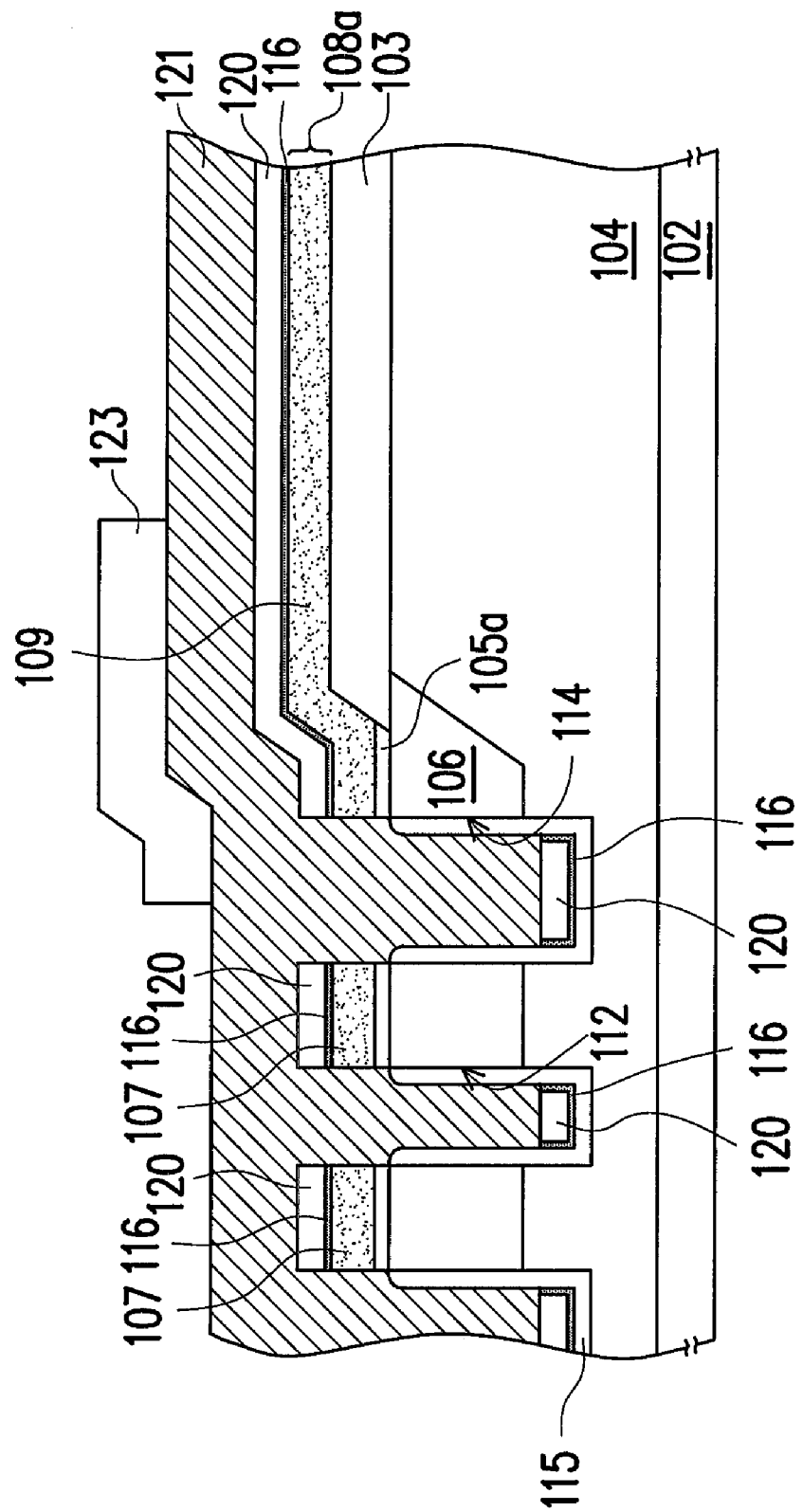

Referring to FIG. 6D, a blanket etching process is performed by using the mask layer 116 as a stop layer, so as to remove the oxide material layer 118 located on the sidewalls of the trenches 112, the trench 114, the mask patterns 107 and the mask pattern 109, and leave an oxide layer 120 located on the tops of the mask patterns 107 and the mask pattern 109 and on the bottoms of the trenches 112 and the trench 114. In an embodiment, the oxide layer 120 has a thickness of about 2000 Å. The blanket etching process includes a wet etching process, and the etching solution thereof is, for example, buffer oxide etchant (BOE) or diluted hydrofluoric acid (DHF).

The mask layer 116 uncovered by the oxide layer 120 is then removed. The mask layer 116 uncovered by the oxide layer 120 is removed by performing a wet etching process, and the etching solution thereof is phosphoric acid ($H_3PO_4$), for example. It is noted that the purpose of forming the oxide layer 120 on the bottoms of the trenches 112 and the trench 114 is to lower the gate-to-drain capacitance $C_{gd}$ so as to effectively reduce the switching loss.

Figure 6E:
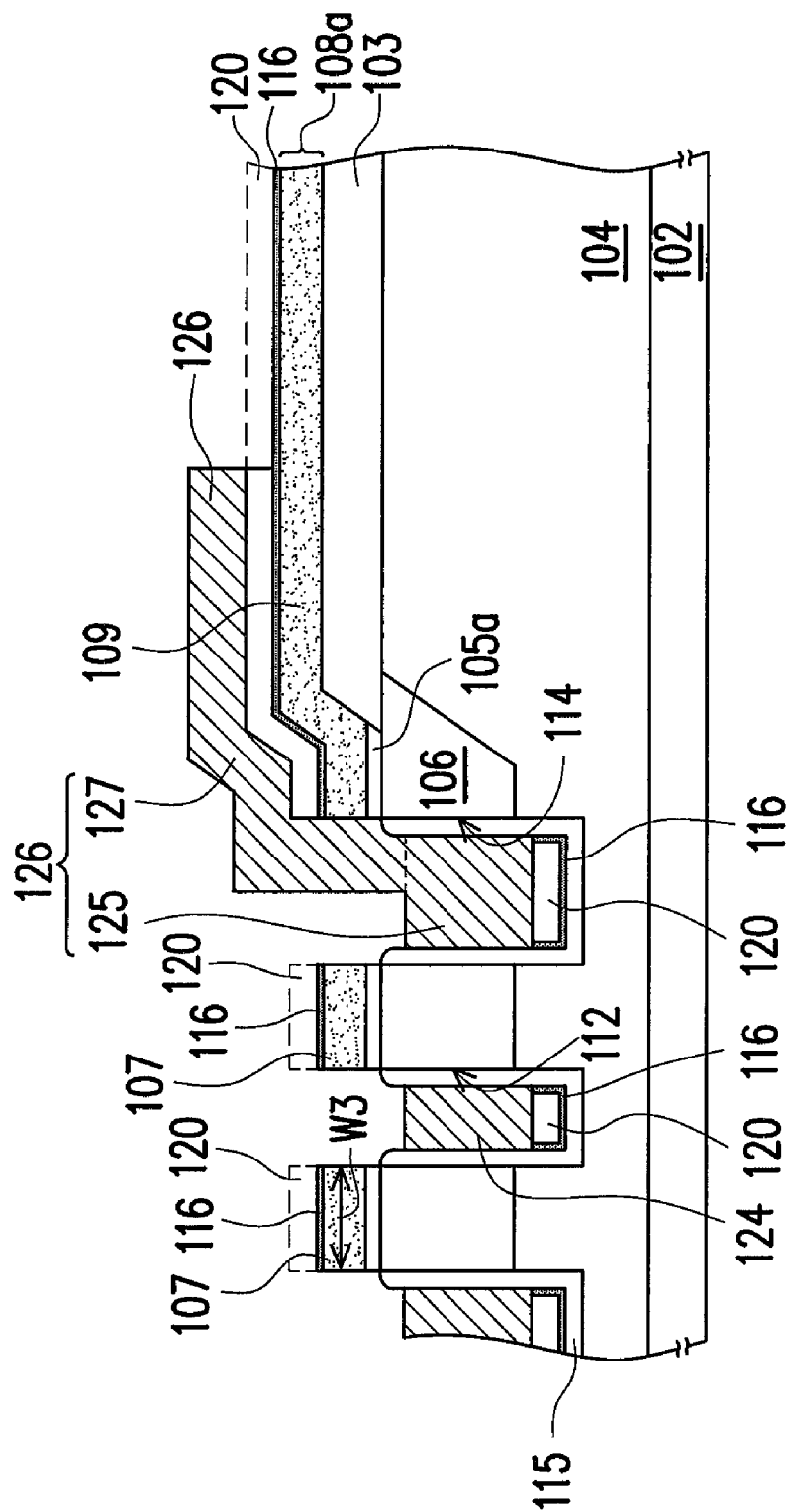

Referring to FIG. 6E, a conductive layer 124 is formed in the trenches 112 and a conductive layer 126 is formed in the trench 114, and the conductive layer 126 extends to a portion of the isolation structure 103. The method of forming the conductive layers 124 and 126 includes sequentially forming a conductive material layer 121 and a patterned photoresist layer 123 (as shown in FIG. 6D) on the substrate 102 filling the trenches 112 and the trench 114. The conductive material layer 121 includes N+ doped polysilicon, for example. Next, a dry etching process is performed to the conductive material layer 121 by using the patterned photoresist layer 123 as a mask, so as to remove a portion of the conductive material layer 121. In this embodiment, the conductive layer 126 includes a first part 125 filling in the trench 114 and a second part 126 extending from the first part 125 to a portion of the isolation structure 103, and the subsequently formed dielectric layer 129a (as shown in FIG. 6G) covers a portion of the first part 125.

In an embodiment, after the step of forming the conductive layers 124 and 126, a thermal oxidation process can be optionally performed to the conductive layers 124 and 126 to enhance the withstand voltage level of the conductive layers 124 and 126. In addition, the surface of either the conductive layer 124 or the first part 125 of the conductive layer 126 is no higher than that of the body layer 106. That is, the surface of either the conductive layer 124 or the first part 125 of the conductive layer 126 is substantially equal to or lower than that of the body layer 106. The oxide layer 120 on the mask pattern 107 and the oxide layer 120 uncovered by the conductive layer 126 are then removed.

Figure 6F:
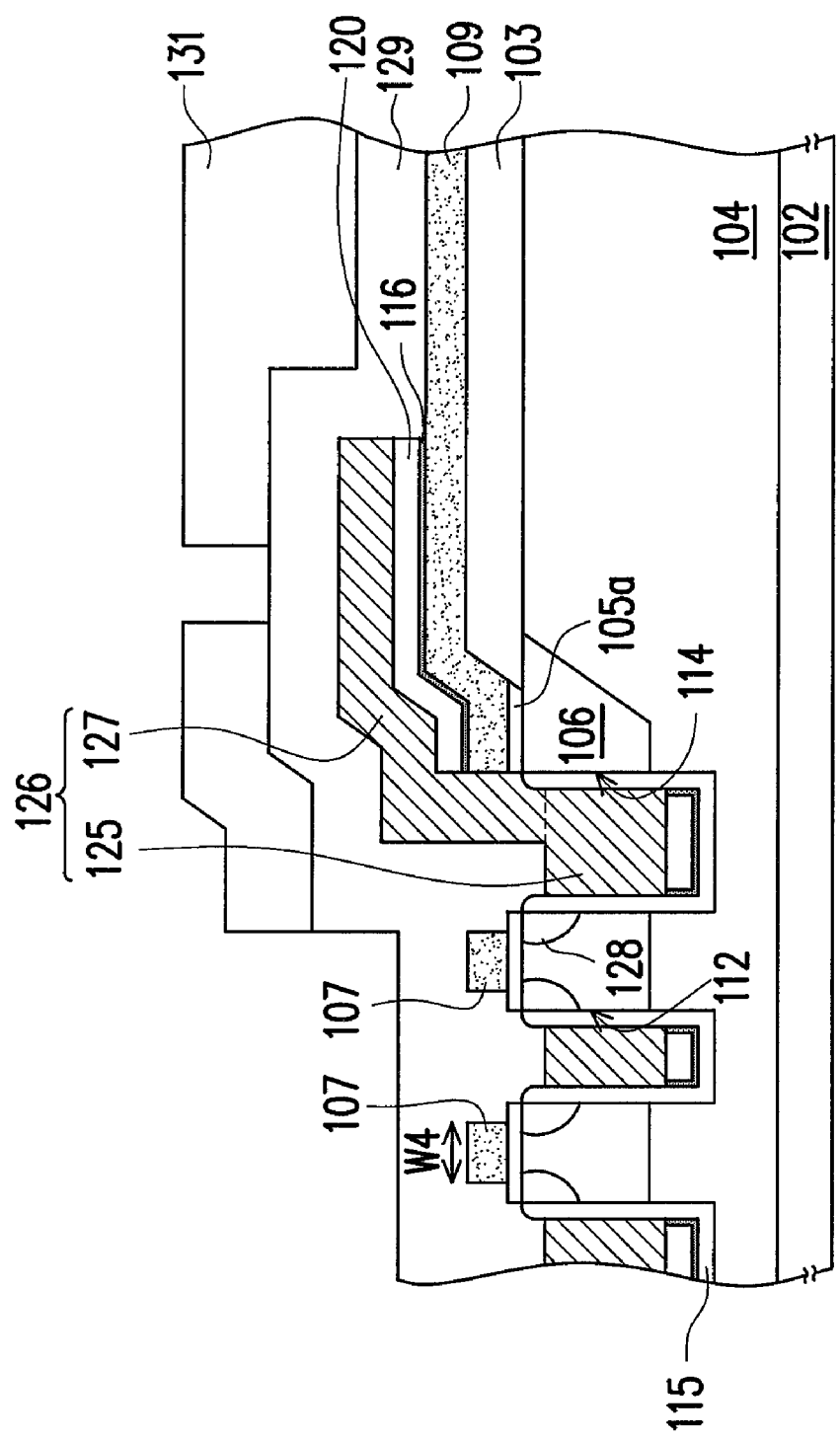
Figure 6G:
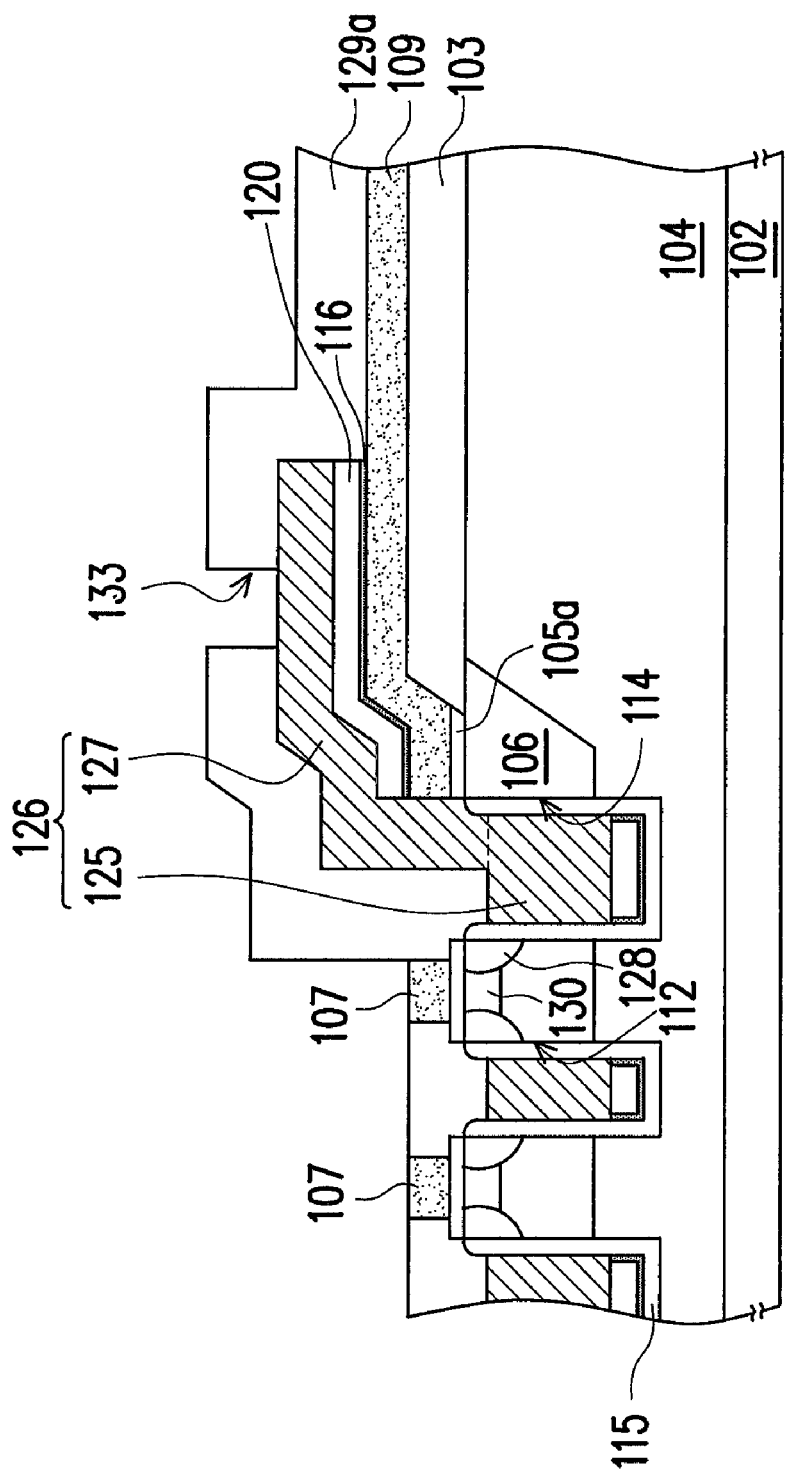

Referring to FIG. 6F, a trimming process is performed to the mask patterns 107 for reducing the line width of each of the mask patterns 107. The line width of the mask patterns 107 is reduced from W3 (as shown in FIG. 6E) to W4 (as shown in FIG. 6F). The trimming process includes a wet etching process, and the etching solution thereof is phosphoric acid, for example. In an embodiment, since the mask patterns 107 and the mask layer 116 are all made of silicon nitride, the mask layer 116 located on the mask patterns 107 is simultaneously removed during the step of trimming the mask patterns 107. Further, the trimming process is substantially a blanket etching process, so that the mask layer 116 on the mask pattern 109 and uncovered by the conductive layer 126 is also removed.

Afterwards, at least one source region 128 of the first conductivity type is formed in the body layer 106 at one side of the trench 114 by using the trimmed mask patterns 107 as a mask. In this embodiment, except one source region 128 is disposed in the body layer 126 adjacent to the trench 114, other source regions 128 are disposed in the body layer 106 beside each trench 112. The source regions 128 are N+ doped regions, and the N-type dopants include phosphorus or arsenic, for example. The step of forming the source regions 128 includes performing an ion implantation process and a subsequent drive-in process; thus, a portion of the formed source region 124 extends beneath the mask patterns 107. The ion implantation process for forming the source regions 128 adopts the trimmed mask patterns 107 as a mask, and is thus a self-aligned process.

Thereafter, a dielectric material layer 129 is formed on the substrate 102 covering the trimmed mask patterns 107, the conductive layer 124 and the conductive layer 126. The dielectric material layer 129 includes silicon oxide, BPSG, PSG, FSG, or USG, for example. The method of forming the dielectric material layer 129 includes performing a CVD process, for example. Afterwards, a patterned photoresist layer 131 is formed on the dielectric material layer 129.

Referring to FIG. 6G, a portion of the dielectric material layer 129 is removed by using the patterned photoresist layer 131 as a mask, so as to form a dielectric layer 129a. The dielectric layer 129a exposes the surfaces of the trimmed mask patterns 107 and has an opening 133 exposing a portion of the conductive layer 126. The method of forming the dielectric layer 129a includes performing a dry etching process, for example.

Figure 6H:
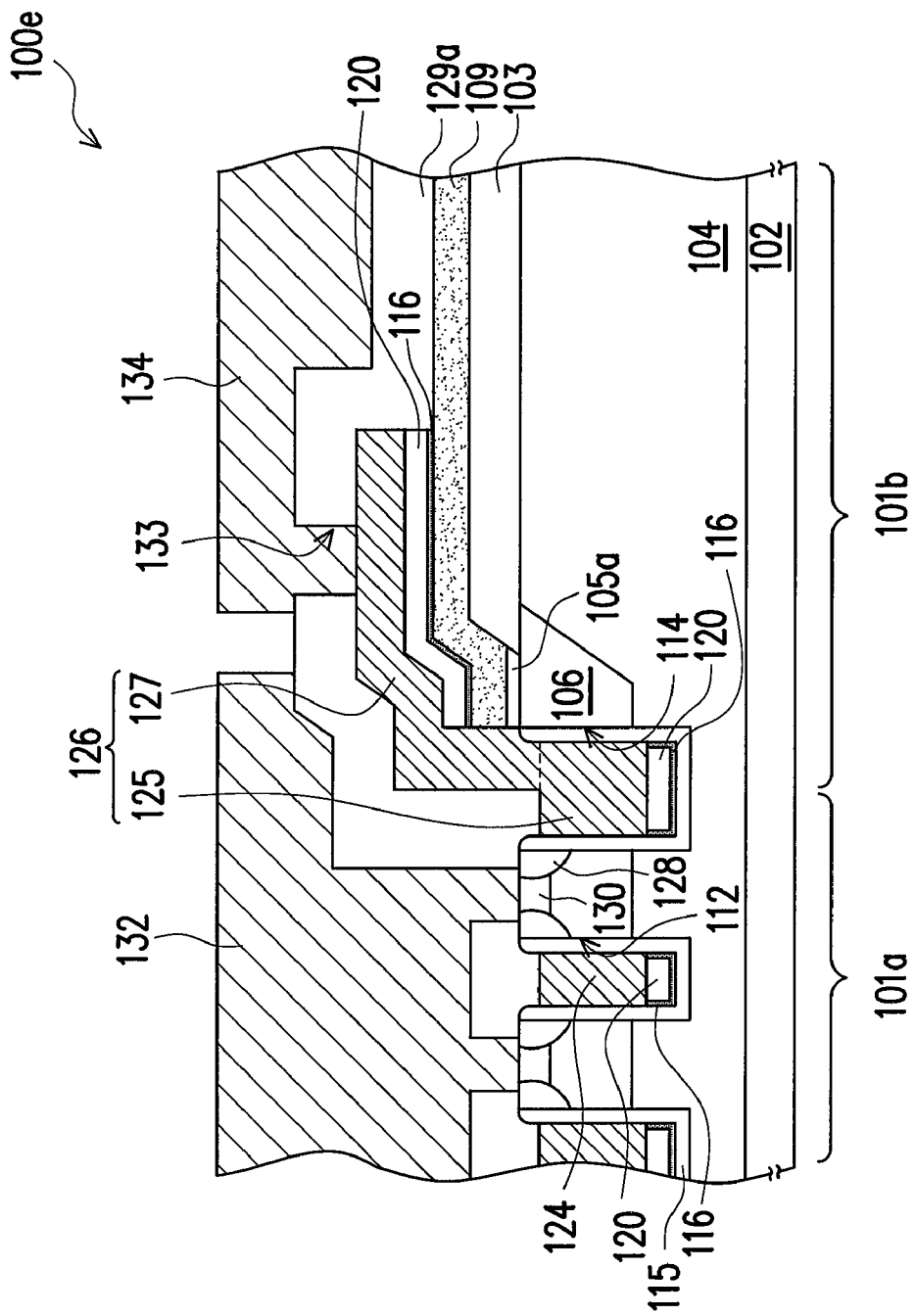

Referring to FIG. 6H, the trimmed mask patterns 107 are removed. Subsequently, the pad oxide layer 105a located beneath the trimmed mask patterns 107 is removed. The method of removing the pad oxide layer 105a includes a wet etching process, and the etching solution thereof is, for example, BOE or DHF. In an embodiment, a portion of the dielectric layer 129a is simultaneously removed during the step of removing the pad oxide layer 105a. Next, at least one doped region 130 of the second conductivity type is formed in the body layer 106 by using the dielectric layer 129a as a mask. The doped regions 130 are formed to reduce the resistance between the subsequently formed contact plugs and the body layer 106. The doped regions 130 are P+ doped regions, and the P-type dopants include boron, for example. The ion implantation process for forming the doped regions 130 adopts the dielectric layer 129a as a mask and is thus a self-aligned process. In addition, a portion of the P-type dopants is doped into the conductive layer 126 through the opening 133 of the dielectric layer 129a. However, the conductive layer 126 is a N+ doped polysilicon layer, and the doped concentration thereof is much higher than that of the P-type doped regions 130, so that the performance of the conductive layer 126 is not affected.

Afterwards, a conductive layer 132 and a conductive layer 134 which are separated from each other are formed on the substrate 102. The conductive layer 132 is electrically connected to the source regions 128 and the doped regions 130 while electrically isolated from the conductive layer 126 by the dielectric layer 129a. The conductive layer 134 is electrically connected to the conductive layer 126 through the opening 133 of the dielectric layer 129a. The method of forming the conductive layers 132 and 134 includes sequentially forming a conductive material layer (not shown) and a patterned photoresist layer (not shown) on the substrate 102. The conductive material layer includes aluminium, and the forming method thereof includes performing a CVD process, for example. A dry etching process is then performed by using the patterned photoresist layer as a mask to remove a portion of the conductive material layer. The formation of the power MOSFET 100e is thus completed.

In the method of forming the power MOSFET 100e, after the step of forming the trenches 112 and the trench 114 and before the step of forming the oxide layer 115, the mask pattern 109 covering the isolation structure 103 is removed. The method of removing the mask pattern 109 covering the isolation structure 103 includes performing a photolithography process and an etching process, for example. Further, the following process steps are omitted: the step of forming the mask layer 116 and the oxide material layer 118, the step of removing a portion of the oxide material layer 118 to form the oxide layer 120, and the step of removing the mask layer 116 uncovered by the oxide layer 120. The formation of the power MOSTET 100a is thus completed.

In the method of forming the power MOSFET 100a, during the step of forming the conductive layers 124 and 126, the pattern positions of the patterned photoresist layer 123 are changed, so that the first part 125 and the second part 127 of the conductive layer 126 are aligned in their borders at the top of the trench 114; that is, the dielectric layer 129a does not cover the first part 125. The formation of the power MOSTET 100b is thus completed.

In the method of forming the power MOSFET 100e, the following process steps are omitted: the step of forming the mask layer 116 and the oxide material layer 118, the step of removing a portion of the oxide material layer 118 to form the oxide layer 120, and the step of removing the mask layer 116 uncovered by the oxide layer 120. The formation of the power MOSTET 100c is thus completed.

In the method of forming the power MOSFET 100e, after the step of forming the trenches 112 and the trench 114 and before the step of forming the oxide layer 115, the mask pattern 109 covering the isolation structure 103 is removed. The formation of the power MOSTET 100d is thus completed.

In summary, in the power MOSFET of the present invention, the trench 114 is located in both the cell area 101a and the terminator 101b, and the conductive layer 126 fills in the trench 114 and extends to a portion of the isolation structure 103, so that the cell area 101a and the terminator 101b including the gate metal area and the metal field plate area can be effectively integrated so as to reduce the dimension of the device. Compared with a conventional power MOSFET, the power MOSFET of the present invention can reduce the dimension of the terminator by about 10-20 um, so that the level of integration of the device can be significantly enhanced.

Besides, the method of the present invention adopts a trimming process and a self-aligned process to form the contact plugs of power MOSFETs, so that misalignments do not occur between the contact plugs and the trenches. Therefore, the cell pitch can be minimized. In other words, the trench-to-trench distance can be reduced to the limit (that is, the photolithographic resolution) of a photolithographic station, and the trimming process and the self-aligned process are adopted to form the contact plugs, so that the cell pitch can be reduced greatly to enhance the level of integration of the device.

Furthermore, the method of the present invention is simple and does not require additional photomasks. The formation of the source regions 128, the doped regions 130, and the contact plugs can be completed by using the self-aligned process, so that the production cost is significantly reduced and the competitive advantage is achieved.

In addition, the gate oxide layer (that is, the oxide layer 115) of the present invention is formed by a single thermal oxidation process. Consequently, deterioration of the device performance caused by discontinuous interface of a conventional gate oxide layer does not occur.

Moreover, the bottom oxide layer (that is, the second oxide layer 120) formed on the bottoms of the trenches 112 and the trench 114 is made of an oxide with a dielectric constant smaller than 4. The gate-to-drain capacitance $C_{gd}$ can thus be lowered to effectively reduce the switching loss.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. A power metal-oxide-semiconductor field effect transistor (MOSFET), comprising:
    a substrate of a first conductivity type;
    an epitaxial layer of the first conductivity type, disposed on the substrate;
    a body layer of a second conductivity type, disposed in the epitaxial layer, wherein a trench is disposed in the body layer and in a portion of the epitaxial layer;
    an isolation structure, disposed on the substrate at one side of the trench;
    a first oxide layer, disposed on a surface of the trench;
    a first conductive layer, filling in the trench and extending to a portion of the isolation structure;
    a dielectric layer, disposed on the first conductive layer and the isolation structure and having an opening exposing a portion of the first conductive layer;
    at least one source region of the first conductivity type, disposed in the body layer at the other side of the trench;
    a second conductive layer, disposed on the dielectric layer and electrically connected to the source region while electrically isolated from the first conductive layer by the dielectric layer; and
    a third conductive layer, disposed on the dielectric layer and electrically connected to the first conductive layer through the opening of the dielectric layer, wherein the second conductive layer and the third conductive layer are separated from each other,
    wherein the first conductive layer comprises a first part filling in the trench and a second part extending from the first part to the portion of the isolation structure, and the dielectric layer covers on a portion of a surface of the first part directly, and the surface of the first part of the first conductive layer is no higher than a surface of the body layer.

2. The power MOSFET of claim 1, wherein the first conductive layer comprises a first part filling in the trench and a second part extending from the first part to the portion of the isolation structure, and the dielectric layer does not cover the first part.

3. The power MOSFET of claim 2, wherein a surface of the first part of the first conductive layer is no higher than a surface of the body layer.

4. The power MOSFET of claim 1, wherein the body layer and isolation structure and partially overlapped or separated from each other.

5. The power MOSFET of claim 1, further comprising a second oxide layer at least disposed on a bottom of the trench.

6. The power MOSFET of claim 5, wherein the second oxide layer comprises an oxide with a dielectric constant less than 4.

7. The power MOSFET of claim 5, wherein the second oxide is further disposed between a top surface of the isolation structure and the first conductive layer.

8. The power MOSFET of claim 7, further comprising a mask layer disposed between the second oxide layer and the first oxide layer and between the top surface of the isolation structure and the second oxide layer.

9. The power MOSFET of claim 8, wherein the mask layer comprises silicon nitride.

10. The power MOSFET of claim 8, further comprising a mask pattern covering the isolation structure, wherein the mask pattern is disposed between the mask layer and the isolation structure.

11. The power MOSFET of claim 10, wherein the mask pattern comprises silicon nitride.

12. The power MOSFET of claim 1, further comprising a mask pattern covering the isolation structure.

13. The power MOSFET of claim 12, wherein the mask pattern comprises silicon nitride.

14. The power MOSFET of claim 1, further comprising at least one doped region of the second conductivity type disposed between the second conductive layer and the body layer.

15. The power MOSFET of claim 1, further comprising a pad oxide layer disposed between the body layer and the first conductive layer.

16. The power MOSFET of claim 1, wherein the isolation structure comprises a field oxide structure or a shallow trench isolation structure.

17. The power MOSFET of claim 1, wherein the first conductive layer comprises doped polysilicon.

18. The power MOSFET of claim 1, wherein the second conductive layer and the third conductive layer comprise aluminium.

19. The power MOSFET of claim 1, wherein the first conductive type is N-type while the second conductivity type is P-type, or the first conductivity type is P-type while the second conductivity type is N-type.

* * * * *